(12) United States Patent
Johnson et al.

(10) Patent No.: US 7,985,639 B2
(45) Date of Patent: Jul. 26, 2011

(54) METHOD FOR FABRICATING A SEMICONDUCTOR DEVICE HAVING A SEMICONDUCTIVE RESISTOR STRUCTURE

(75) Inventors: Frank Scott Johnson, Wappingers Falls, NY (US); Douglas Bonser, Hopewell Junction, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 110 days.

(21) Appl. No.: 12/562,873

(22) Filed: Sep. 18, 2009

(65) Prior Publication Data

US 2011/0070712 A1    Mar. 24, 2011

(51) Int. Cl.
*H01L 21/336* (2006.01)
*H01L 21/8234* (2006.01)

(52) U.S. Cl. ........ 438/197; 257/513; 257/680; 257/692; 257/733

(58) Field of Classification Search .................. 438/197, 438/199, 311, 158, 159, 513, 208, 663, 680, 438/692, 712, 745, 754, 657; 257/E21.17, 257/6, 51, 54, 58, 77, 14, 94, 218, 227, 229, 257/304, 421, 632
See application file for complete search history.

(56) References Cited

U.S. PATENT DOCUMENTS

| | | | |
|---|---|---|---|
| 6,720,231 B2 * | 4/2004 | Fried et al. | 438/382 |
| 6,872,647 B1 | 3/2005 | Yu et al. | |
| 6,921,963 B2 | 7/2005 | Krivokapic et al. | |
| 7,064,413 B2 * | 6/2006 | Fried et al. | 257/536 |
| 2010/0301417 A1 * | 12/2010 | Cheng et al. | 257/355 |

* cited by examiner

*Primary Examiner* — David Nhu
(74) *Attorney, Agent, or Firm* — Ingrassia Fisher & Lorenz, P.C.

(57) ABSTRACT

Methods are provided for fabricating a semiconductor device. A method forms a conductive fin arrangement on a first region of a semiconductor substrate. The method continues by forming a semiconductive resistor structure on a second region of the semiconductor substrate after forming the conductive fin arrangement, and forming a gate stack foundation structure overlying the conductive fin arrangement after forming the semiconductive resistor structure. The method removes portions of the gate stack foundation structure overlying the first region of the semiconductor substrate to define a gate structure for the semiconductor device.

20 Claims, 18 Drawing Sheets

METHOD FOR FABRICATING A SEMICONDUCTOR DEVICE HAVING A SEMICONDUCTIVE RESISTOR STRUCTURE

TECHNICAL FIELD

Embodiments of the subject matter generally relate to semiconductor devices and methods for fabricating semiconductor devices, and more particularly, embodiments of the subject matter relate to methods for forming semiconductive resistors on a semiconductor device.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

A FinFET is a type of transistor that can be fabricated using very small scale processes. FIG. 1 is a simplified perspective view of a FinFET 100, which is formed on a semiconductor wafer substrate 102. A FinFET is named for its use of one or more conductive fins 104. As shown in FIG. 1, each fin 104 extends between a source region 106 and a drain region 108 of FinFET 100. FinFET 100 includes a gate structure 110 that is formed across fins 104. The surface area of the fins 104 in contact with gate structure 110 determines the effective channel of FinFET 100.

BRIEF SUMMARY

A method is provided for fabricating a semiconductor device. The method comprises forming a conductive fin arrangement on a first region of a semiconductor substrate. The method further comprises forming a semiconductive resistor structure on a second region of the semiconductor substrate after forming the conductive fin arrangement, and forming a gate stack foundation structure overlying the conductive fin arrangement after forming the semiconductive resistor structure. The method further comprises removing portions of the gate stack foundation structure overlying the first region of the semiconductor substrate to define a gate structure for the semiconductor device.

Another method is provided for fabricating a semiconductor device. The method comprises forming a conductive fin arrangement on a first region of a semiconductor substrate. The method further comprises forming a semiconductive resistor structure on a second region of the semiconductor substrate and forming a gate stack foundation structure overlying the conductive fin arrangement and the semiconductive resistor structure. The method further comprises removing portions of the gate stack foundation structure overlying the semiconductive resistor structure and forming a plurality of dielectric layers overlying the conductive fin arrangement and the semiconductive resistor structure. The method further comprises removing portions of the gate stack foundation structure and the plurality of dielectric layers overlying the conductive fin arrangement to define a gate structure for the semiconductor device.

In another embodiment, a method for fabricating a semiconductor device is provided. The method comprises forming a conductive fin arrangement on a first region of a semiconductor substrate, forming a semiconductive resistor structure on a second region of the semiconductor substrate, and forming a gate stack foundation structure overlying the conductive fin arrangement and the semiconductive resistor structure. The method further comprises forming a plurality of dielectric layers overlying the gate stack foundation structure and removing portions of a first layer of the plurality of dielectric layers to provide a substantially planar surface, wherein the first layer overlies a second layer of the plurality of dielectric layers. The method further comprises removing portions of the gate stack foundation structure and the plurality of dielectric layers overlying the first region of the semiconductor substrate to define a gate structure for the semiconductor device.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the manufacture of MOS components are well known and so, in the interest of brevity, many conventional steps will only be mentioned briefly herein or will be omitted entirely without providing the well known process details.

A variety of FinFET devices and related fabrication processes are known. In traditional integrated fabrication techniques for FinFETs that include a polysilicon resistor (or other passive structures), the polysilicon is often used as part of the gate stack as well as for the resistor. As a result, the thickness and composition of the polysilicon can not be optimized for the resistor. The fabrication techniques described herein can be utilized to optimize the thickness, grain structure (or crystal structure), and doping of polysilicon for the resistor while utilizing fewer masks than conventional integrated fabrication techniques.

Figure 1:
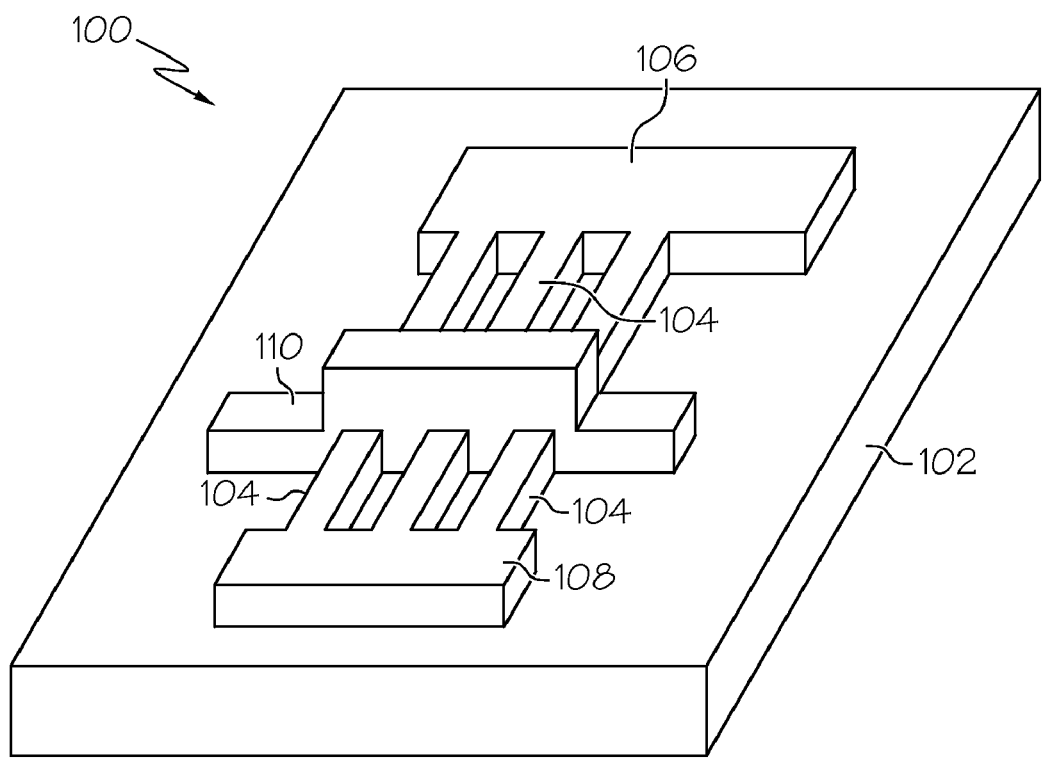
FIG. 1 is a simplified perspective view of a conventional FinFET having a plurality of fins.
Figure 2:
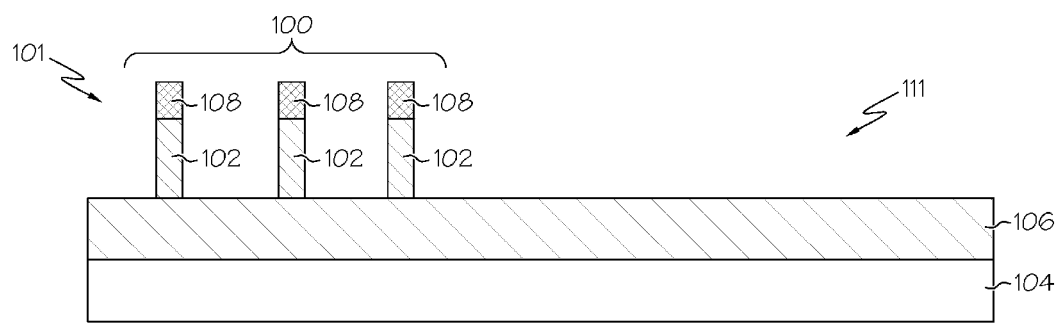
FIGS. 2-18 are cross-sectional views and top views that illustrate a semiconductor device structure and exemplary methods for fabricating the semiconductor device structure.

FIGS. 2-18 illustrate methods for fabricating a semiconductor device in accordance with exemplary embodiments. Referring to FIG. 2, the illustrated fabrication process begins by forming a conductive fin arrangement 100 comprising one or more conductive fins on an appropriate semiconductor substrate. In an exemplary embodiment, the fins of the conductive fin arrangement 100 comprise a semiconductor material 102. The semiconductor material 102 is preferably a silicon material, wherein the term "silicon material" is used herein to encompass the relatively pure silicon materials typically used in the semiconductor industry as well as silicon admixed with other elements such as germanium, carbon, and the like. Alternatively, the semiconductor material 102 can be germanium, gallium arsenide, or the like. In an exemplary embodiment, the thickness of the semiconductor material 102 is about 65 angstroms, however, in practical embodiments, the thickness of the semiconductor material 102 may range from about 40 angstroms to about 200 angstroms.

In an exemplary embodiment, conductive fin arrangement 100 is formed from a silicon-on-insulator (SOI) substrate having a support layer 104, a layer of insulating material 106 on the support layer 104, and a layer of semiconductor material 102 on the layer of insulating material 106. The insulating material 106 is preferably realized as an oxide layer formed in a subsurface region of the semiconductor substrate, also known as a buried oxide (BOX) layer. In an exemplary embodiment, the thickness of the insulating material 106 is about 300 angstroms, however, in practical embodiments, the thickness of the insulating material 106 may range from about 50 angstroms to about 1000 angstroms. To fabricate the conductive fin arrangement 100, a layer of insulating material 108 is formed overlying the layer of semiconductor material 102. Portions of the insulating material 108 and the semiconductor material 102 are selectively removed to obtain the fins of the conductive fin arrangement 100 overlying a first region 101 of the insulating layer 106 and a second region 111 of the semiconductor substrate that does not have conductive fins formed thereon. In accordance with one embodiment, the portions of the insulating material 108 and the semiconductor material 102 are selectively removed by forming one or more nitride spacers overlying the insulating material 108 to define the one or more conductive fins of the conductive fin arrangement 100 and anisotropically etching the exposed portions of the insulating material 108 and the semiconductor material 102 to expose the underlying insulating layer 106.

After forming the conductive fin arrangement 100, the one or more nitride spacers are removed and the remaining semiconductor material 102 of the conductive fin arrangement 100 may be implanted with ions, for example, to form an N-region or a P-region for the channel of a subsequently formed transistor, as will be appreciated in the art. It should be understood that the fabrication process described herein is not constrained by the number of conductive fins in the conductive fin arrangement 100 or the manner in which the conductive fin arrangement 100 is formed. In this regard, although the conductive fins 100 are shown as having an insulating material 108 overlying the semiconductor material 102, in practice, the conductive fins 100 need not include the insulating material 108. Furthermore, it should be understood that the fabrication process described herein is not constrained by the dimensions of the semiconductor material 102.

Figure 3:
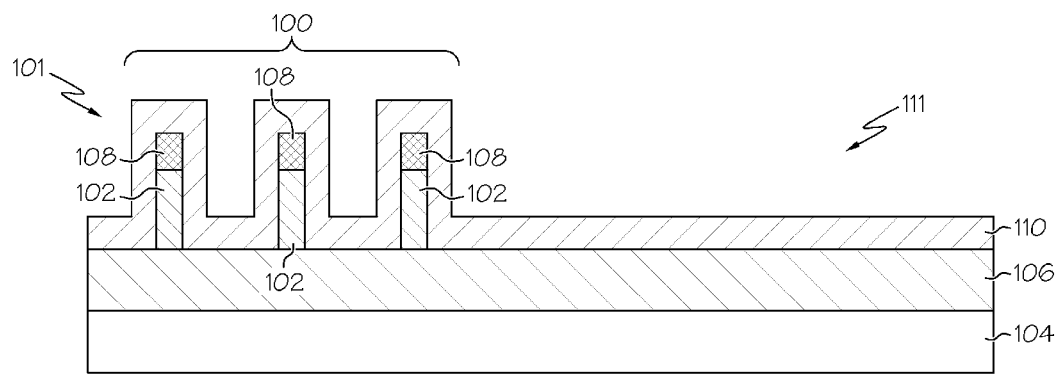

Referring now to FIG. 3, in an exemplary embodiment, the fabrication process continues by forming a layer of semiconductive material 110 overlying the conductive fin arrangement 100 and the insulating layer 106. In an exemplary embodiment, the semiconductive layer 110 is formed by conformally depositing a layer of polycrystalline silicon (or polysilicon) overlying the conductive fin arrangement 100 and the insulating layer 106. The layer of polysilicon 110 can be deposited by chemical vapor deposition (CVD), for example, by low-pressure chemical vapor deposition (LPCVD) by the hydrogen reduction of silane. In an exemplary embodiment, the polysilicon layer 110 is deposited with a thickness of about 500 angstroms, however, in practical embodiments, the thickness of the polysilicon layer 110 may range from about 100 angstroms to about 5000 angstroms. Depending on the embodiment, the polysilicon 110 may be deposited as doped polycrystalline silicon or undoped polycrystalline silicon. In an exemplary embodiment, the doping, thickness, and grain structure of the polysilicon layer 110 are chosen to optimize the absolute resistance as well as the thermal coefficient of resistance of a resistor structure subsequently formed from the polysilicon layer 110, as described in greater detail below. In this regard, if desired, the polysilicon layer 110 may be blanket doped without patterning after being deposited and annealed at any desired temperature to achieve desired electrical characteristics for a particular application.

Figure 4:
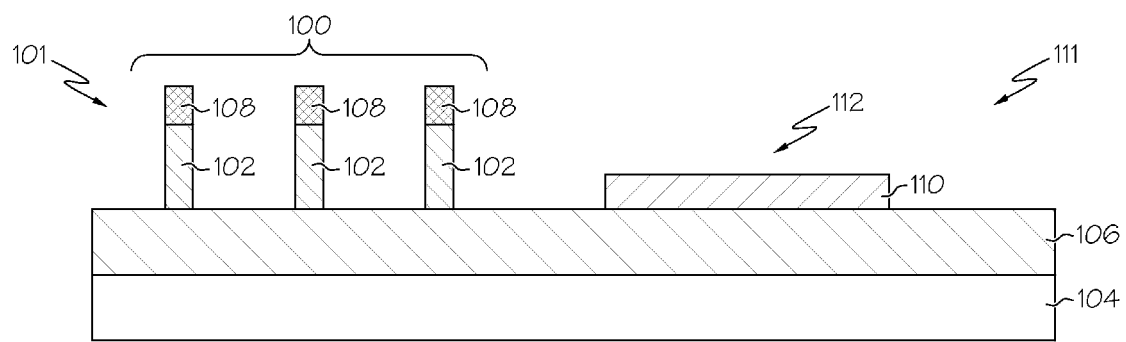
Figure 5:
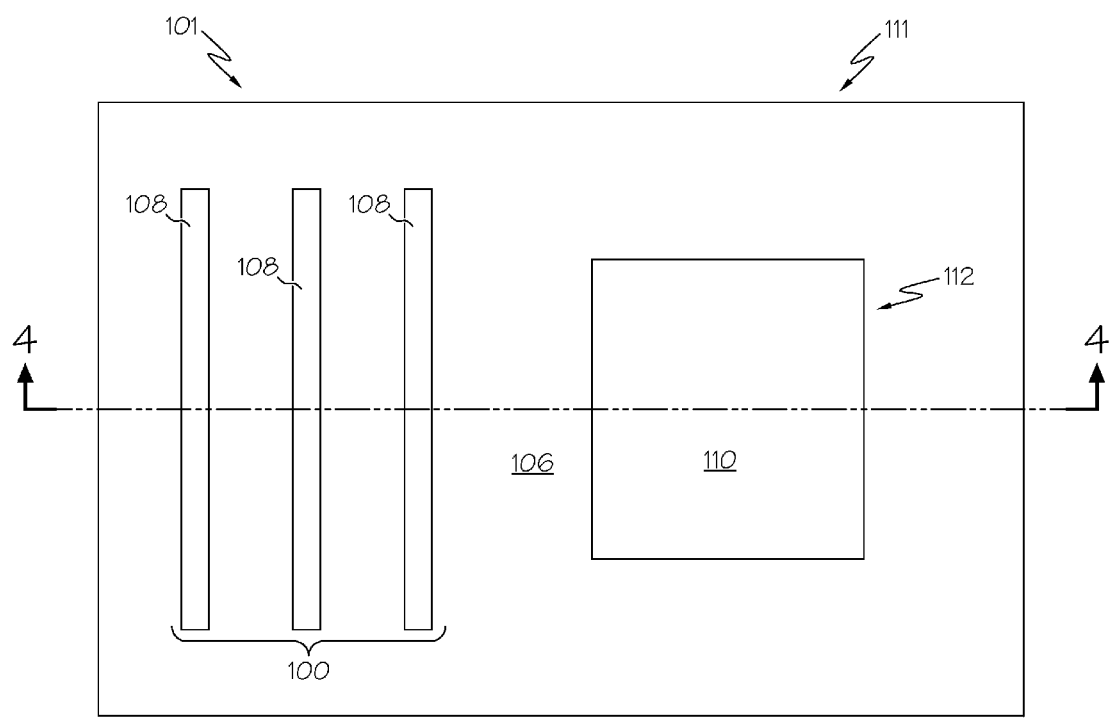

Referring now to FIGS. 4 and 5, in an exemplary embodiment, the fabrication process continues by selectively removing portions of the polysilicon layer 110 to define a semiconductive resistor structure 112 overlying the region 111 of the semiconductor substrate that does not have conductive fins formed thereon. In this regard, FIG. 5 depicts a top view of the semiconductor substrate after removing the exposed portions of the polysilicon layer 110 to define the resistor structure 112 overlying the insulating layer 106. In accordance with one embodiment, the resistor structure 112 is formed by applying and patterning a layer of photoresist material to mask the portion of the polysilicon layer 110 to be used for the resistor structure 112. Thereafter, the exposed portions of the polysilicon layer 110 are removed from the conductive fin arrangement 100 and the insulating layer 106. Because the resistor structure 112 has a relatively large critical dimension, the exposed portions of the polysilicon layer 110 may be removed by isotropically etching the exposed polysilicon layer 110 from the conductive fin arrangement 100 and the insulating layer 106. For example, the exposed polysilicon layer 110 may be removed with a wet isotropic etch or a dry isotropic etch using commonly known etchant chemistries such as, for example, ammonium hydroxide, which has the advantage of etching polysilicon with good selectivity, a hydrogen fluoride nitric acid mixture or fluoride-based plasma chemistries. In alternative embodiments, the exposed polysilicon layer 110 may be removed from the conductive fin arrangement 100 and the insulating layer 106 by anisotropically etching the exposed polysilicon layer 110 using suitable etchant chemistries and processes known in the art. After etching the polysilicon layer 110 from the conductive fin arrangement 100, the layer of photoresist is removed resulting in the structure shown in FIGS. 4 and 5.

Figure 6:
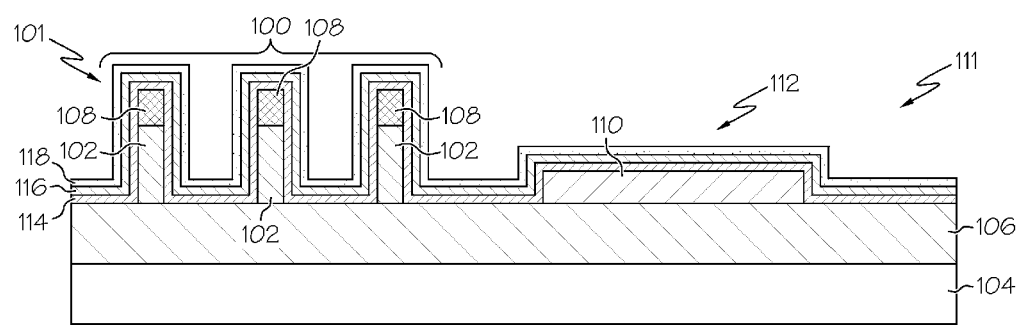

Referring now to FIG. 6, in an exemplary embodiment, the fabrication process continues by forming a gate stack foundation structure overlying the conductive fin arrangement 100 and the resistor structure 112. The gate stack foundation structure comprises one or more layers of material that will comprise the gate structure for the transistor subsequently formed on the first region 101 of the semiconductor substrate. The gate stack foundation structure may comprise one or more layers of different materials, such as, for example, a layer of dielectric material, a layer of a work function setting material (e.g., a gate metal or another conductive material), or a layer of a capping material (e.g., a capping metal such as lanthanum oxide or aluminum oxide). In an exemplary embodiment, the gate structure is realized as a high-k metal gate wherein the gate stack foundation structure comprises at least one high-k dielectric layer and at least one conductive metal layer, as will be appreciated in the art. It should be understood that various numbers, combinations and/or arrangements of materials may be utilized for the gate stack in a practical embodiment, and the subject matter described herein is not limited to any particular number, combination, or arrangement of gate material(s) in the gate stack.

As shown in FIG. 6, in an exemplary embodiment, the fabrication process forms the gate stack foundation structure by forming a layer of dielectric material 114 overlying the conductive fin arrangement 100 and the resistor structure 112. In an exemplary embodiment, the dielectric material is conformally deposited overlying the conductive fin arrangement 100, the resistor structure 112, and the surrounding insulating layer 106 by a sputter deposition process or a CVD deposition process. In an exemplary embodiment, dielectric layer 114 is formed from a high-k dielectric material, that is, the dielectric layer 114 comprises a dielectric material having a dielectric constant greater than about 4.0, such as, for example, hafnium oxide or hafnium silicon oxynitride. Depending on the embodiment, the thickness of the dielectric layer 114 may range from about 10 angstroms to about 100 angstroms. In alternative embodiments, the dielectric layer 114 may be formed by growing a dielectric material, such as silicon dioxide, on exposed surfaces of the conductive fin arrangement 100 and the resistor structure 112.

In an exemplary embodiment, after forming the dielectric layer 114, the fabrication process continues by forming a layer of a capping material 116 overlying the dielectric layer 114. Depending on the embodiment, the capping material 116 may be realized as a rare earth oxide, such as lanthanum oxide, or a metal oxide, such as aluminum oxide. In an exemplary embodiment, the capping layer 116 is formed by conformally depositing the layer of capping material overlying the dielectric layer 114 by a sputter deposition process or a CVD deposition process. Depending on the embodiment, the thickness of the capping layer 116 may range from about 3 angstroms to about 30 angstroms.

In an exemplary embodiment, after forming the capping layer 116, the fabrication process continues by forming a layer of conductive material 118 overlying the capping layer 116. In accordance with one embodiment, the conductive layer 118 is formed by conformally depositing a conductive metal layer, such as titanium nitride (TiN), tantalum nitride (TaN), tungsten nitride (WN) or another metal nitride, overlying the capping layer 116 by a sputter deposition process or a CVD deposition process. In some embodiments, the conductive layer 118 may be formed by conformally depositing polysilicon overlying the capping layer 116. Depending on the embodiment, the thickness of the metal layer 118 may range from about 20 angstroms to about 500 angstroms. In some embodiments, to reduce the gate resistivity, a second low-resistive metal layer (not shown) may be deposited over the conductive layer 118 having a thickness ranging from about 50 angstroms to about 500 angstroms.

Figure 7:
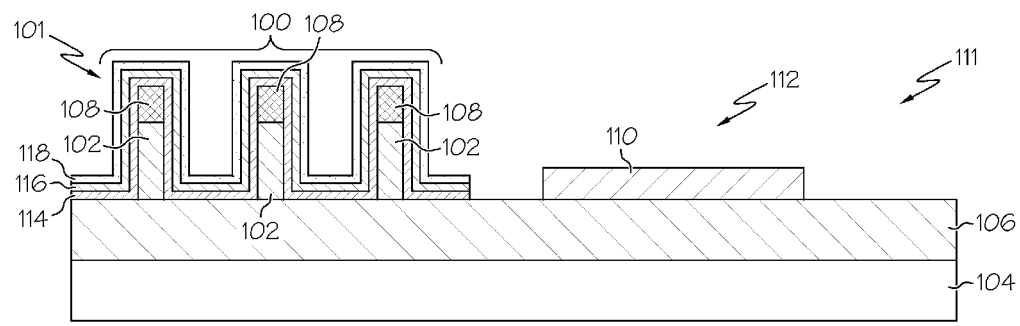
Figure 8:
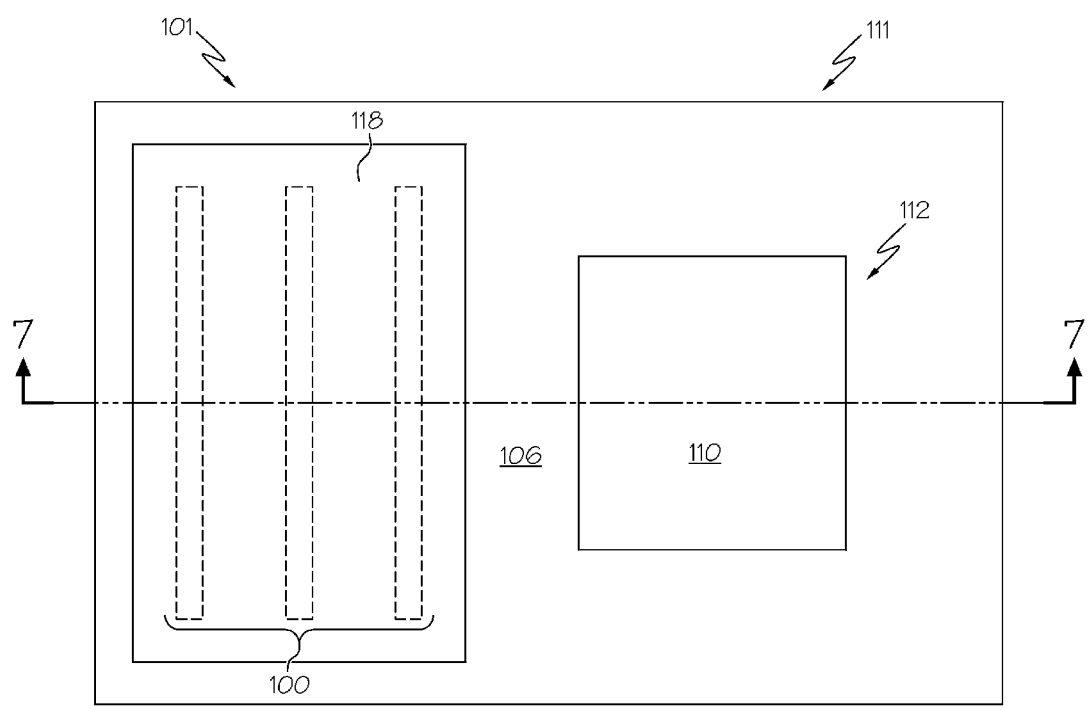

Referring now to FIGS. 7 and 8, in an exemplary embodiment, the fabrication process continues by selectively removing the gate stack layers 114, 116, 118 from the resistor structure 112. In this regard, FIG. 8 depicts a top view of the semiconductor substrate after removing the gate stack layers 114, 116, 118 from the resistor structure 112. In accordance with one embodiment, a layer of photoresist may be applied and patterned to mask the region about the conductive fin arrangement 100. The exposed portions of the gate stack layers 114, 116, 118 can then be removed from the resistor structure 112 using the patterned photoresist material as an etch mask. In an exemplary embodiment, the gate stack layers 114, 116, 118 are removed from the resistor structure 112 by plasma-based reactive ion etching (RIE) or chemical etching with commonly known etchant chemistries. As described in greater detail below, in alternative embodiments, the fabrication process may continue without removing the gate stack layers 114, 116, 118 from the resistor structure 112 at this point in the fabrication process.

Figure 9:
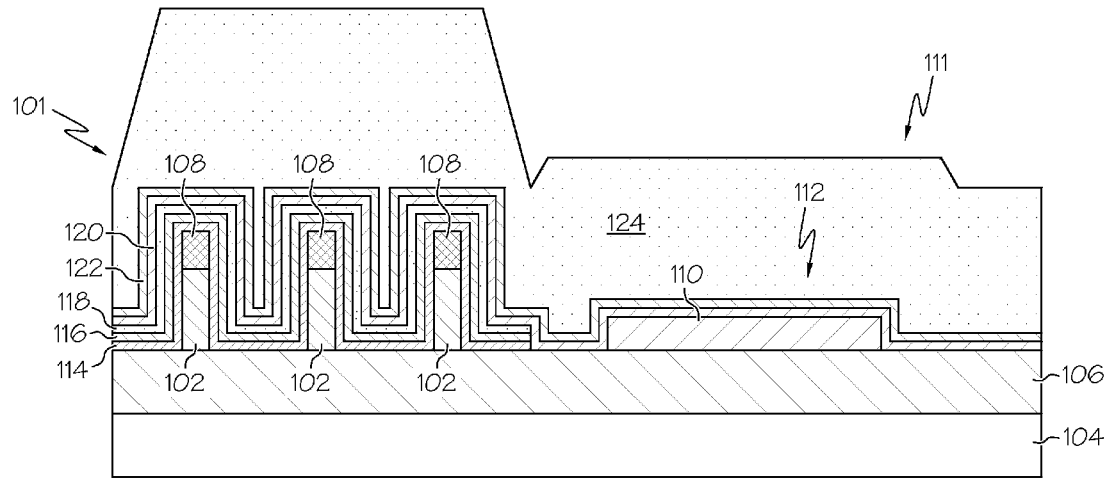

Referring now to FIG. 9, in an exemplary embodiment, the fabrication process continues by forming one or more dielectric layers overlying the conductive fin arrangement 100 and the resistor structure 112. In the illustrated embodiment, the fabrication process continues by forming a first dielectric layer 120 overlying the conductive fin arrangement 100 (e.g., metal layer 118) and the resistor structure 112, forming a second dielectric layer 122 overlying the first dielectric layer 120, and forming a third dielectric layer 124 overlying the second dielectric layer 122. In an exemplary embodiment, the dielectric material comprising the third dielectric layer 124 is different from the dielectric material comprising the second dielectric layer 122, which in turn is different from the dielectric material comprising the first dielectric layer 120. It should be understood that the respective thicknesses of the dielectric layers 120, 122, 124 will depend on the height and pitch (the distance between fins) of the conductive fin arrangement 100 taking into account the thickness of the intervening gate stack layers 114, 116, 118, as described in greater detail below. Furthermore, although the subject matter is described in the context of using three dielectric layers 120, 122, 124, in practice, the fabrication process may be implemented using fewer dielectric layers or a greater number of dielectric layers.

In an exemplary embodiment, the dielectric layers 120, 122, 124 are formed by conformally depositing a layer of a first dielectric material overlying the conductive fin arrangement 100, the insulating layer 106 and the resistor structure 112, conformally depositing a layer of a second dielectric material overlying the first dielectric layer 120, and conformally depositing a layer of a third dielectric material overlying the second dielectric layer 122. In an exemplary embodiment, each dielectric layer 120, 122, 124 is deposited using a sputter deposition process or a CVD deposition process. Depending on the embodiment, the thickness of the first dielectric layer 120 may range from about 50 angstroms to about 400 angstroms, the thickness of the second dielectric layer 122 may range from about 100 angstroms to about 300 angstroms, and the thickness of the third dielectric layer 124 may range from about 500 angstroms to about 1000 angstroms. The thickness of the third dielectric layer 124 is preferably chosen such that any gaps between conductive fins of the fin arrangement 100 and/or gaps between the fin arrangement 100 and the resistor structure 112 are all filled to a minimum height that meets or exceeds the height of the conductive fins 100 including the gate stack layers 114, 116, 118 and underlying dielectric layers 120, 122.

In an exemplary embodiment, the first dielectric layer 120 comprises a material that prevents formation of silicide during subsequent steps of the fabrication process, as described in greater detail below. In an exemplary embodiment, the second dielectric layer 122 comprises material that functions as an etch stop when etching nitride spacers during subsequent process steps. In an exemplary embodiment, the third dielectric layer 124 comprises a material that is distinguishable from the underlying dielectric layer 122 during subsequent planarization steps. In an exemplary embodiment, the first dielectric layer 120 comprises a nitride material, such as silicon nitride, the second dielectric layer 122 comprises an oxide material, such as silicon oxide, and the third dielectric layer 124 comprises a nitride material, such as silicon nitride. It should be understood that the particular number and combination of dielectric layers used may vary depending on the particular implementation of the fabrication process, for example, to accommodate the gate patterning process or to prevent undesired interaction of selective source/drain implementation and the spacer etching integration with the gate stack. In this regard, in some embodiments, the fabrication process need not include the third dielectric layer 124 and associated planarization steps described herein if the third dielectric layer 124 is not needed for forming a planar surface to gate patterning. In still other embodiments, first and second dielectric layers 120, 122 may be combined into a single layer of a single type of dielectric compatible with subsequent spacer and source/drain formation techniques described in greater detail below.

Figure 10:
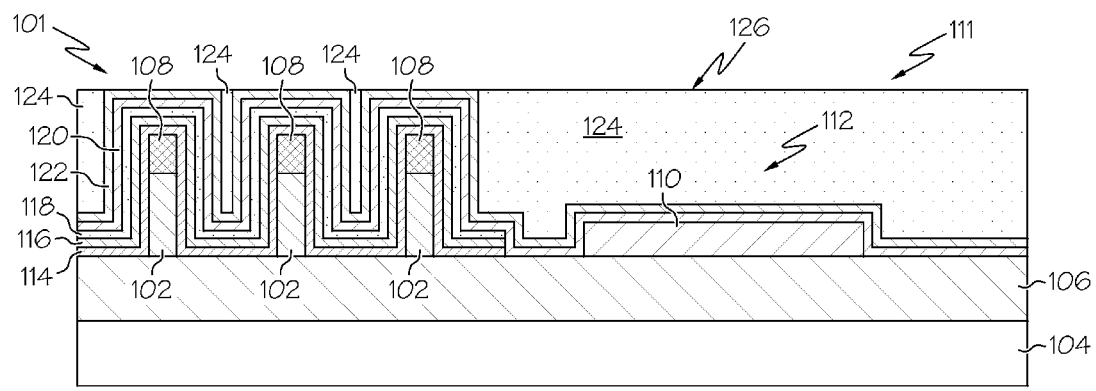

Referring now to FIG. 10, the fabrication process continues by removing at least a portion of the uppermost dielectric layer 124 to obtain a substantially planar surface 126. In an exemplary embodiment, the third dielectric layer 124 is uniformly removed across the semiconductor substrate until reaching the second dielectric layer 122. In other words, the fabrication process ceases planarizing the uppermost dielectric layer 124 when the upper surface of the underlying dielectric layer 122 is exposed. In accordance with one embodiment, chemical-mechanical planarization (CMP) is used to polish the third dielectric layer 124 with a chemical slurry for a predetermined amount of time based on the thickness of the third dielectric layer 124 such that the CMP stops when the upper surface of the second dielectric layer 122 is exposed. Alternative endpoint detection techniques could also be utilized to determine when to stop the CMP procedure. In another embodiment, the third dielectric layer 124 may be removed using etch back planarization by anisotropically etching the third dielectric layer 124 such that the upper surface of the second dielectric layer 122 is exposed.

Figure 11:
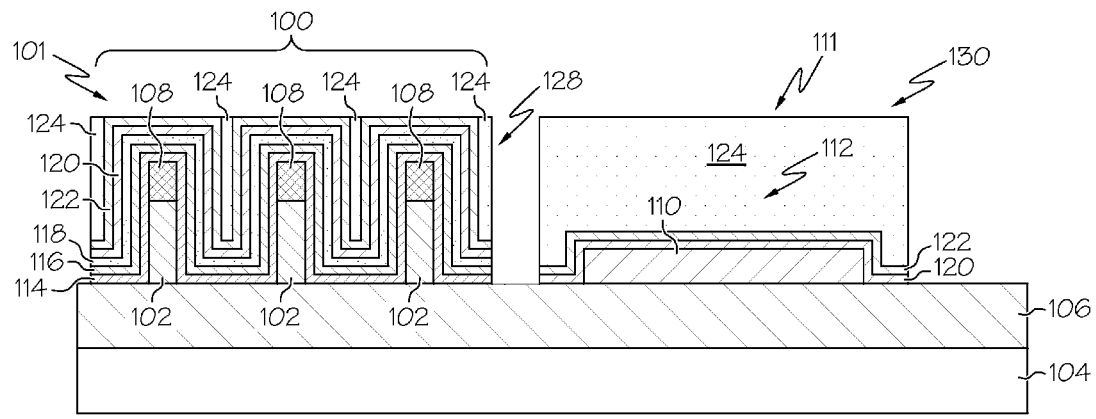
Figure 12:
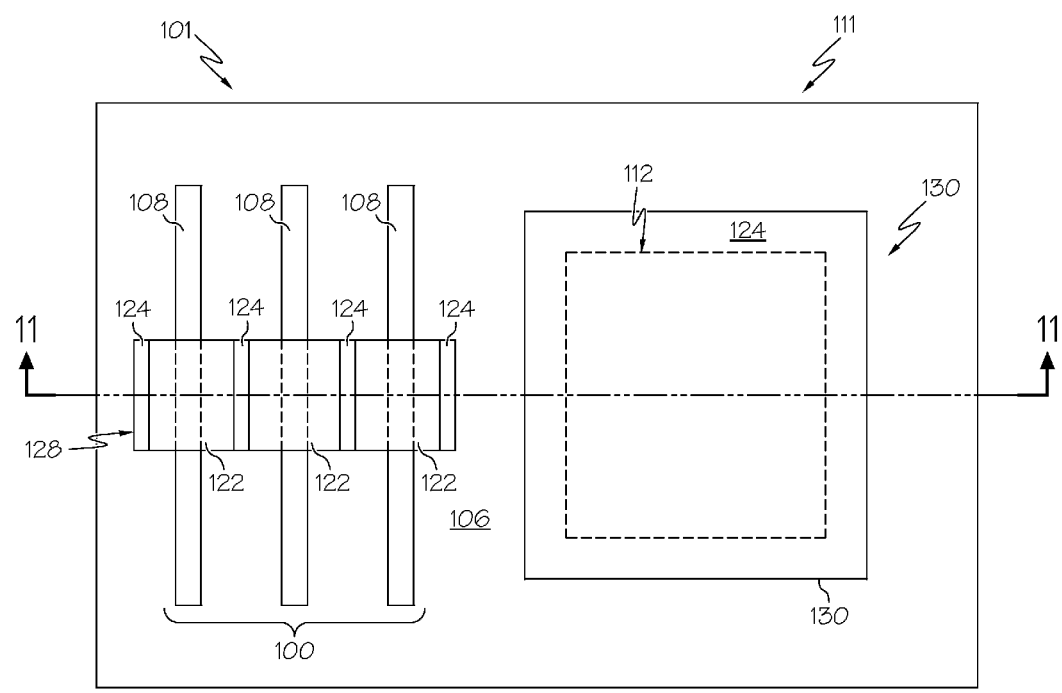
Figure 13:
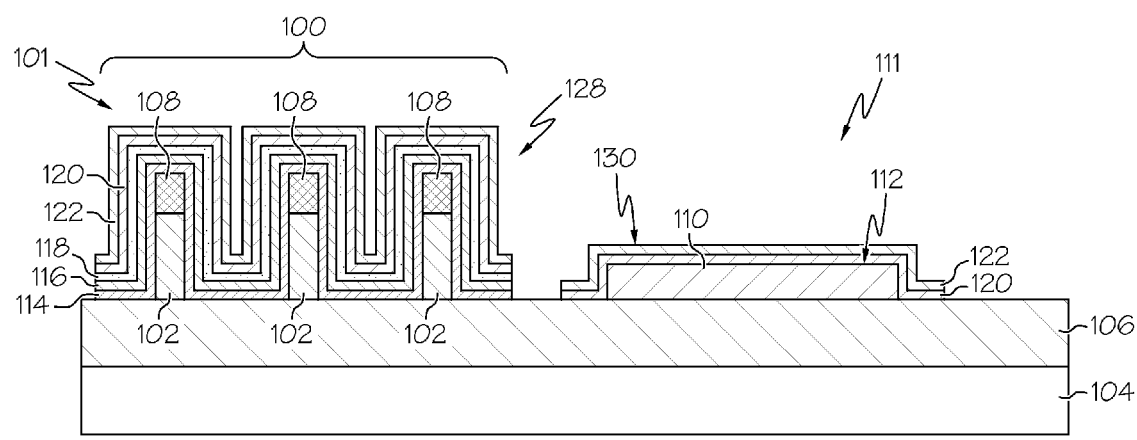

Referring now to FIGS. 11 and 12, in an exemplary embodiment, the fabrication process continues by removing portions of the gate stack layers 114, 116, 118 and the dielectric layers 120, 122, 124 to define a gate structure 128 on the first region of the semiconductor substrate. In an exemplary embodiment, the dielectric layers 120, 122, 124 are concurrently removed from portions of the second region of the semiconductor substrate to define a mask 130 that prevents subsequent epitaxial growth on the resistor structure 112. In this regard, FIG. 12 depicts a top view of the semiconductor substrate after removing portions of the gate stack layers 114, 116, 118 and the dielectric layers 120, 122, 124 to form the gate structure 128 overlying a portion of the conductive fin arrangement 100 and the mask 130 overlying the resistor structure 112. In an exemplary embodiment, a layer of photoresist is applied and patterned to mask the regions for the gate structure 128 and the mask 130. The exposed portions of the dielectric layers 120, 122, 124 are removed by anisotropically etching the dielectric layers 120, 122, 124 by plasma-based reactive ion etching (RIE). After removing the exposed dielectric material 120, 122, 124, the exposed portions of the gate stack layers 114, 116, 118 are removed by anisotropically etching the gate stack layers 114, 116, 118 by plasma-based reactive ion etching (RIE). It should be appreciated that only one photolithography process is needed to create both the gate structure 128 and the mask 130 for the resistor element. If any portions of the third dielectric layer 124 remain after forming the gate structure 128 and the mask 130, in an exemplary embodiment, the fabrication process continues by removing the remaining portions of the third dielectric layer 124 by performing a selective etch process resulting in the structure shown in FIG. 13.

Figure 14:
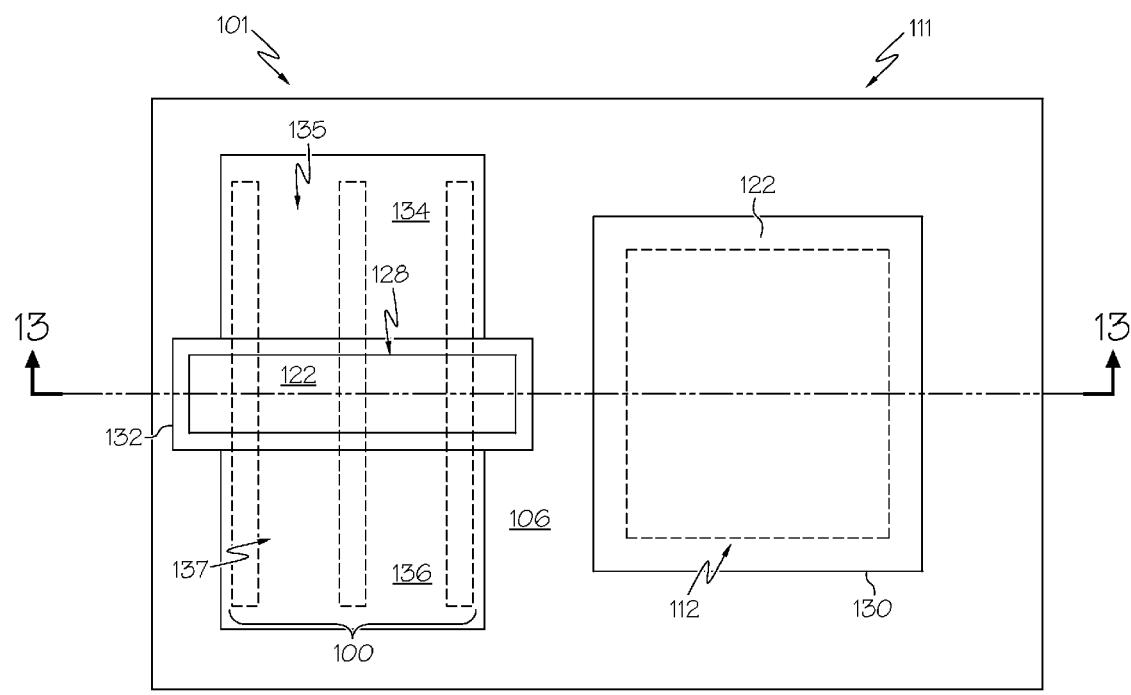

Referring now to FIG. 14, in an exemplary embodiment, after forming the gate structure 128, the fabrication process continues by forming a spacer 132 around the sidewalls of the gate structure 128. In an exemplary embodiment, the spacer 132 is formed by conformally depositing a layer of silicon nitride overlying the conductive fin arrangement 100 and the gate structure 128. In an exemplary embodiment, the silicon nitride layer is deposited by rapid thermal chemical vapor deposition (RTCVD) and has a thickness of about 100 angstroms. After depositing the nitride layer, the spacer 132 is formed by anisotropically etching the nitride layer, for example, by using plasma-based reactive ion etching (RIE) with commonly known etchant chemistries. In an exemplary embodiment, the nitride layer is overetched when forming the spacer 132 to remove any nitride from vertical surfaces of the resistor structure 112. It should be noted that the overetching may partially consume the second dielectric layer 122, however, the thickness of the second dielectric layer 122 is preferably chosen, such that at least a portion of the second dielectric layer 122 remains intact after etching and allows for the formation of a spacer 132 with adequate height.

After forming the spacer 132, the fabrication process continues by forming regions of semiconductor material 134, 136 at exposed ends of the conductive fin arrangement 100. The regions of semiconductor material 134, 136 are formed such that they provide an electrical connection across the respective ends of the conductive fin arrangement 100. In accordance with one embodiment, the regions of semiconductor material 134, 136 are formed by epitaxially growing a layer of semiconductor material on exposed surfaces of the conductive fins 100. In this regard, the nitride spacer 132 and second dielectric layer 122 act as a mask (i.e., selective epitaxy) preventing any epitaxial growth on the surface of the masked portions of the conductive fins 100 or the resistor structure 112. Preferably, the epitaxial layer is grown to a thickness such that the semiconductor material 134, 136 fills the gaps between the conductive fins and provides a connection across the respective end of the conductive fin arrangement 100. In an exemplary embodiment, the epitaxial layer is grown to a thickness of about 200 angstroms. For a PMOS transistor implementation, the epitaxial layer may be realized as epitaxial silicon germanium (SiGe), which applies a compressive longitudinal stress to the channel and increases the mobility of holes in the channel, as will be appreciated in the art. Similarly, for an NMOS implementation, the mobility of electrons in the channel can be increased by applying a tensile longitudinal stress to the channel by epitaxially growing a material having a smaller lattice constant than the semiconductor material 102, such as monocrystalline carbon silicon (C Si), as is known in the art. In an exemplary embodiment, after forming the semiconductor material, the fabrication process continues by implanting ions of a conductivity-determining impurity type into the regions of semiconductor material 134, 136 using the spacer 132 and the second dielectric layer 122 as an implantation mask to create the source and drain regions 135, 137. It should be noted that ions will also be implanted into regions of the conductive fins 100 which are not masked by the spacer 132 or the second dielectric layer 122. After forming the source and drain regions 135, 137 the fabrication process continues by removing the spacer 132 from the sidewalls of the gate structure 128. In an exemplary embodiment, the spacer 132 is removed using a single hot phosphoric acid ($H_3PO_4$) etchant process. It will be appreciated in the art that the exposure to the etchant chemical may also result in simultaneous removal of the remaining second dielectric layer 122 overlying the gate structure 128 and the resistor structure 112.

Figure 15:
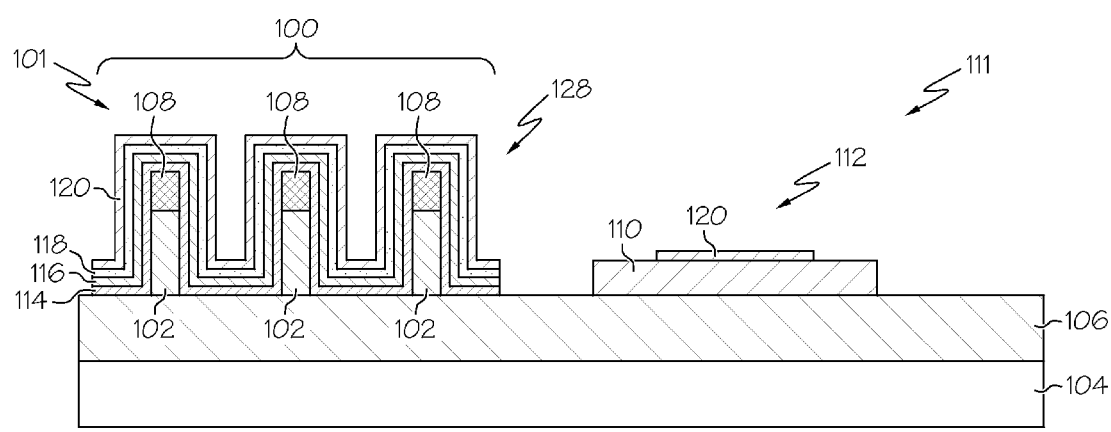
Figure 16:
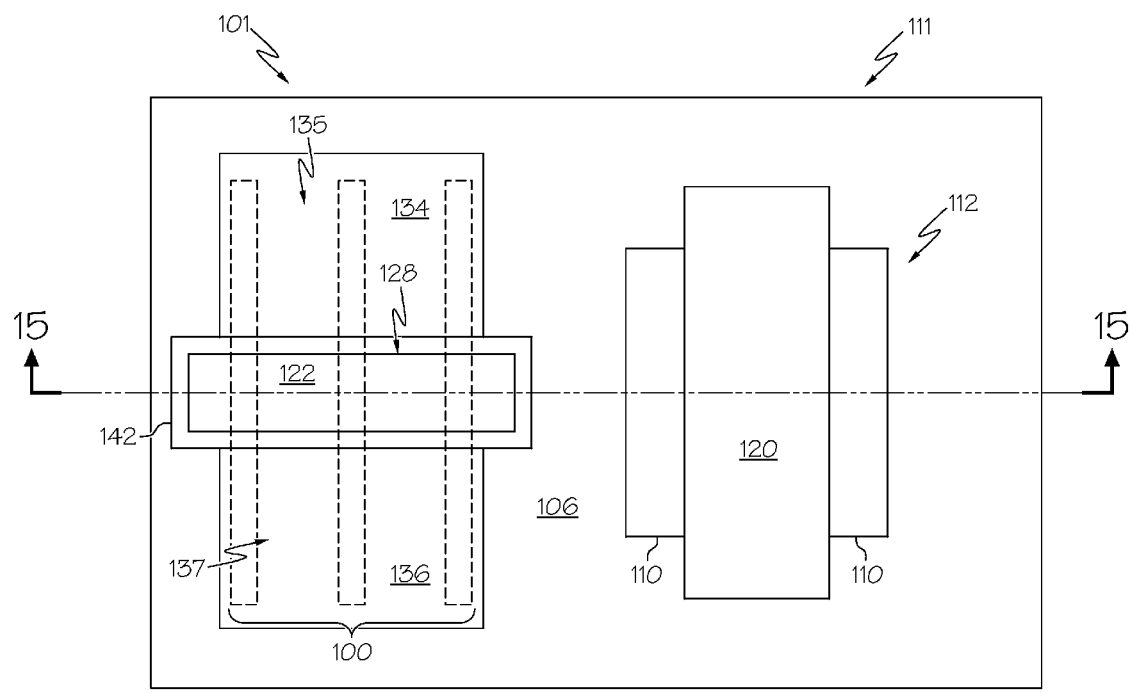

Referring now to FIGS. 15-18, in an exemplary embodiment, the fabrication process continues by forming contact regions 138 on the resistor structure 112 and contact regions 140 on the source and drain regions 135, 137. The contact regions 138, 140 are preferably realized as a metal silicide layer, as described in greater detail below. In an exemplary embodiment, a layer of photoresist is applied and patterned to mask the gate structure 128 and the resistor structure 112, leaving exposed the regions of the resistor structure 112 to be used for forming contact regions 138. The fabrication process continues by removing the exposed portions of the first dielectric layer 120 which are not masked by the photoresist to expose the portions of the polysilicon 110 of the resistor structure 112, as shown in FIGS. 15 and 16. Portions of the first dielectric layer 120 may be removed from the resistor structure 112, for example, by etching the first dielectric layer 120 using plasma-based reactive ion etching (RIE) or a selective chemical etch process. As shown in FIG. 16, in an exemplary embodiment, the layer of photoresist is removed and a spacer 142 is formed about the sidewalls of the gate structure 128 by conformally depositing a layer of silicon nitride overlying the conductive fin arrangement 100, the gate structure 128, the source and drain regions 135, 137, and the resistor structure 112. In an exemplary embodiment, the silicon nitride layer is deposited by plasma-enhanced chemical vapor deposition (PECVD) and has a thickness of about 250 angstroms. After depositing the nitride layer, the spacer 142 is formed by anisotropically etching the nitride layer, for example, by plasma-based reactive ion etching (RIE) using commonly known etchant chemistries. As described in more detail below, the spacer 142 is used to space subsequently formed silicide on the source and drain regions 135, 137 from the channel region, as will be appreciated in the art. It should be noted that anisotropically etching the nitride layer to form sidewall spacer 142 also results in spacer formed on vertical sidewalls of the resistor structure 112, which, depending on the embodiment, may be subsequently removed from vertical sidewalls of the resistor structure 112 in a conventional manner resulting in the structure shown in FIG. 16.

Figure 17:
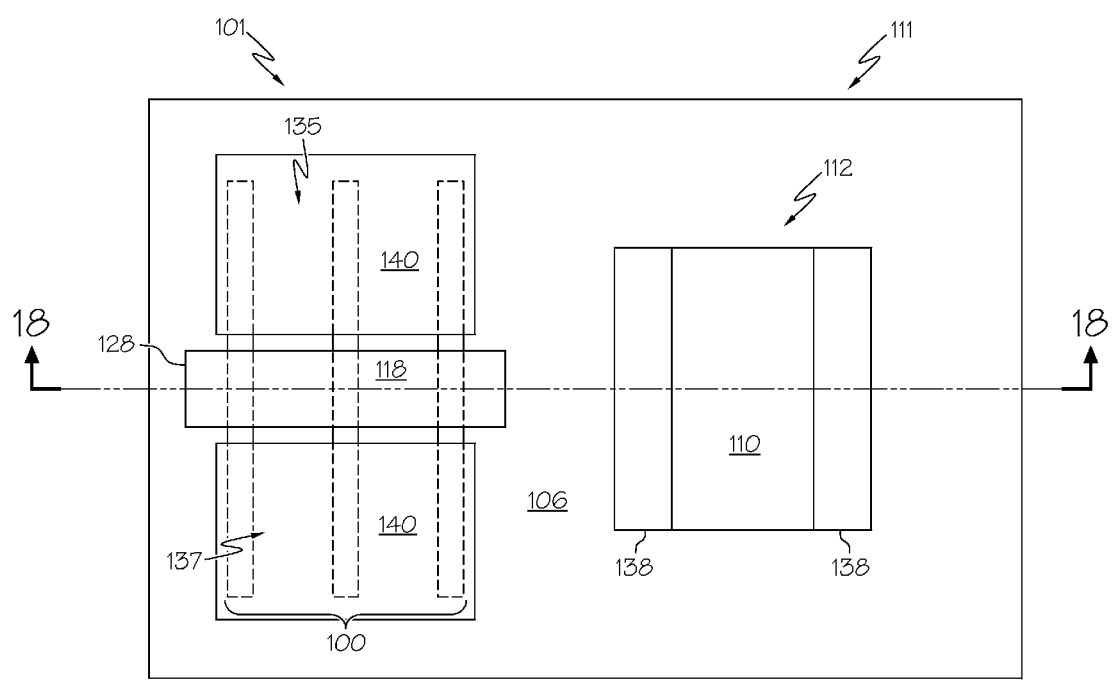
Figure 18:
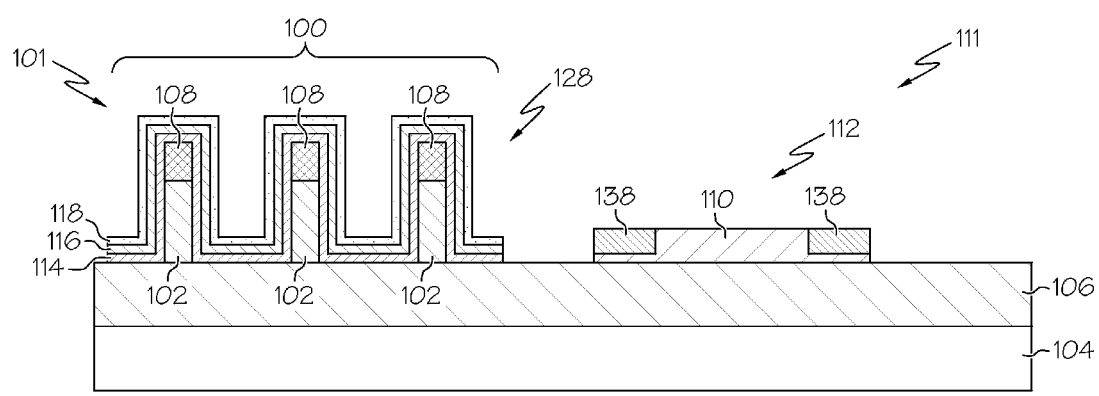

In an exemplary embodiment, after forming the spacer 142, the contact regions 138, 140 are formed by depositing a blanket layer of silicide-forming metal that is subsequently heated, for example by RTA, to react with exposed silicon and form a metal silicide layer 140 at the top of each of the source and drain regions 135, 137 as well as a metal silicide layer 138 on the exposed polysilicon 110 of the resistor structure 112. The silicide-forming metal can be, for example, cobalt, nickel, rhenium, ruthenium, or palladium, or alloys thereof and preferably is nickel. Any silicide-forming metal that is not in contact with exposed silicon, for example the silicide-forming metal that is deposited on the spacer 142, the first dielectric layer 120, or the insulating layer 106 does not react during the RTA to form a silicide and may subsequently be removed by wet etching in a $H_2O_2/H_2SO_4$ or $HNO_3/HCl$ solution. As shown in FIGS. 17 and 18, after formation of the contacts 138, 140, the spacer 142 and the first dielectric layer 120 are removed by a selective wet chemical etch or plasma-based reactive ion etching (RIE) using known etchant chemistries. After forming contact regions 138, 140, the fabrication of the semiconductor device can be completed using any number of known process steps, modules, and techniques. These additional steps are well known and, therefore, will not be described here.

Figure 19:
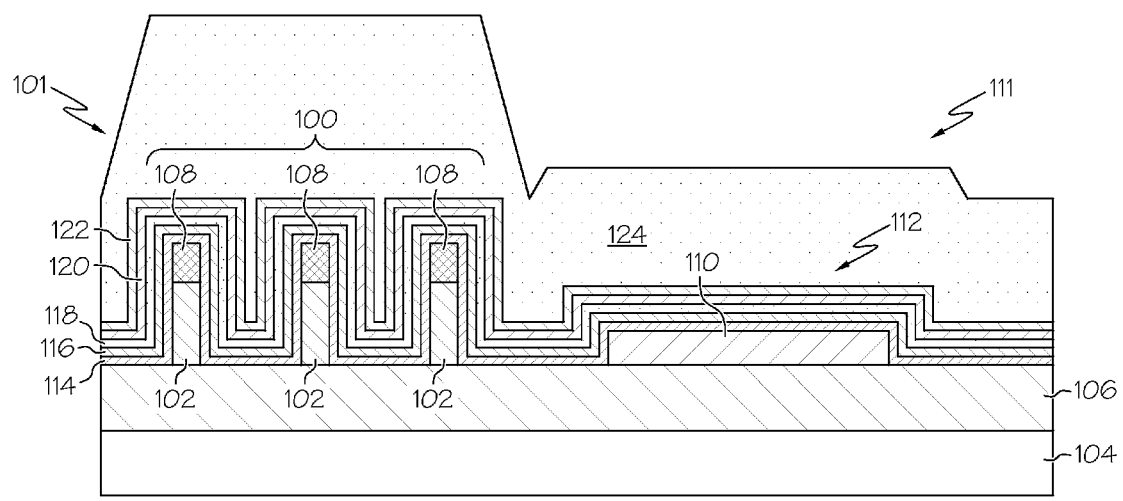
FIGS. 19-21 are cross-sectional views that illustrate a semiconductor device structure and related methods for fabricating the semiconductor device structure in accordance with one embodiment.
Figure 20:
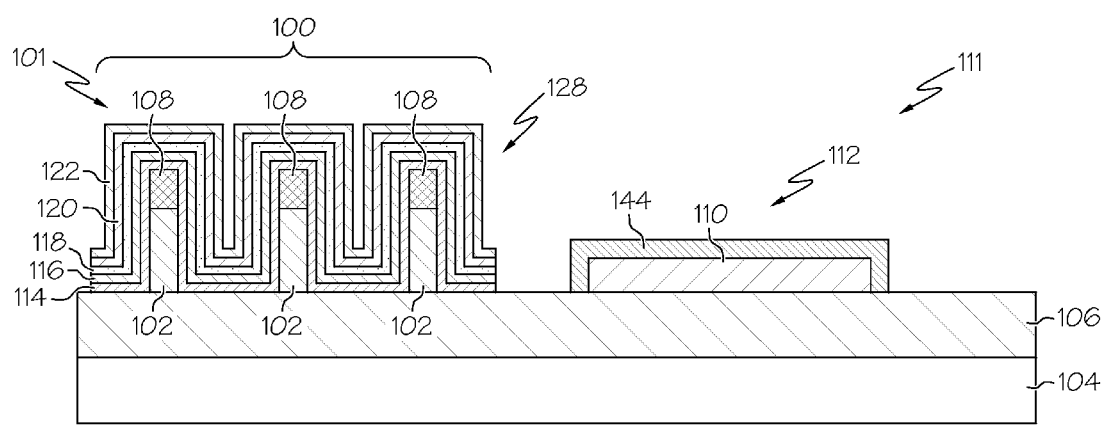
Figure 21:
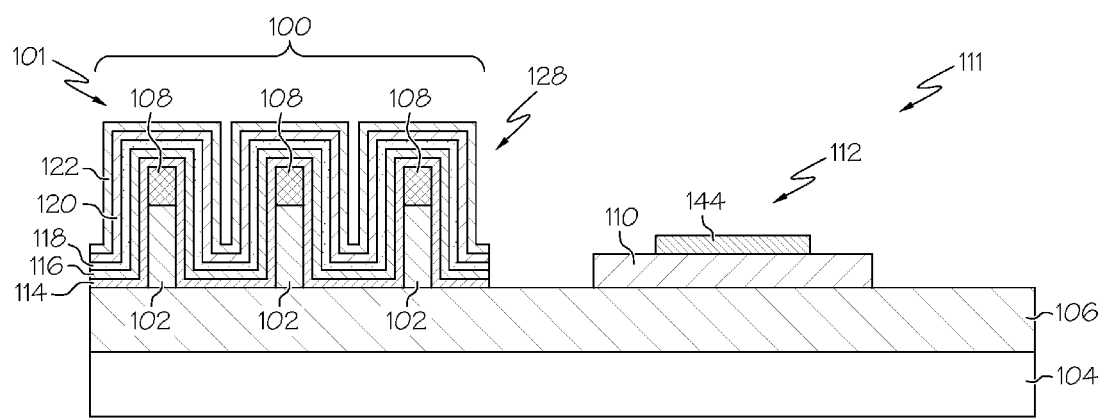

FIGS. 19-21 illustrate an alternate embodiment of the fabrication process described above. In an alternate embodiment, the gate stack layers 114, 116, 118 are not removed from the resistor structure 112 prior to forming the dielectric layers 120, 122, 124. In this alternate embodiment, after removing a portion of the uppermost dielectric layer 124 to obtain a substantially planar surface 126, the gate stack layers 114, 116, 118 and dielectric layers 120, 122, 124 are removed from the resistor structure 112 during the same etch step used to form the gate structure 128 as described in the context of FIGS. 11 and 12, for example, by leaving the entire region 111 of the semiconductor substrate exposed (or unmasked). After removing the gate stack layers 114, 116, 118 and dielectric layers 120, 122, 124 from the resistor structure 112, a mask 144 may be formed overlying the resistor structure 112 to prevent undesired epitaxial growth on, ion implantation and/or silicidation of the polysilicon 110, as shown in FIG. 20. The mask 144 may be formed overlying the polysilicon 110 of the resistor structure 112 concurrently with formation of the spacer 132 and prior to formation of the source and drain regions 135, 137, for example, by conformally depositing the nitride material overlying the resistor structure 112 and applying a layer of photoresist to mask the resistor structure 112 prior to etching to form the spacer 132, as will be appreciated in the art. After forming source and drain regions, the fabrication process continues by exposing regions of the resistor structure 112 to be used for forming contact regions. A layer of photoresist is applied and patterned to mask the gate structure 128 and the resistor structure 112, leaving exposed the regions of the resistor structure 112 to be used for forming contact regions. As shown in FIG. 21, the exposed portions of the mask 144 which are not masked by the photoresist are removed in a similar manner as set forth above in the context of FIGS. 15 and 16. Contact regions are formed on the resistor structure 112 in a similar manner as set forth above in the context of FIGS. 17 and 18, and the fabrication of the semiconductor device can be completed using any number of known process steps, modules, and techniques.

To briefly summarize, one advantage of the methods described above is that the doping, grain structure, and thickness of the polysilicon is not constrained by performance requirements of the gate stack and may be optimized for a particular application. If desired, the polysilicon may be blanket doped without any patterning following deposition and annealed at any desired temperature without effecting diffusion of the source and drain dopant. A plurality of dielectric layers maintains the integrity of the polysilicon during subsequent process steps (e.g., gate stack sidewall spacer formation, source/drain formation).

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising:
   forming a conductive fin arrangement on a first region of a semiconductor substrate, the conductive fin arrangement comprising one or more conductive fins;
   forming a semiconductive resistor structure on a second region of the semiconductor substrate after forming the conductive fin arrangement;
   forming a gate stack foundation structure overlying the conductive fin arrangement after forming the semiconductive resistor structure, the gate stack foundation structure comprising one or more layers of material; and
   removing portions of the gate stack foundation structure overlying the first region of the semiconductor substrate to define a gate structure for the semiconductor device.

2. The method of fabricating a semiconductor device according to claim 1, wherein forming the semiconductive resistor structure comprises:
   depositing a polysilicon layer overlying the first region of the semiconductor substrate and the second region of the semiconductor substrate; and
   removing portions of the polysilicon layer to define the semiconductive resistor structure overlying the second region of the semiconductor substrate.

3. The method of fabricating a semiconductor device according to claim 1, further comprising:
   forming a plurality of dielectric layers overlying the conductive fin arrangement and the semiconductive resistor structure; and
   removing portions of a first layer of the plurality of dielectric layers to provide a substantially planar surface, the first layer overlying a second layer of the plurality of dielectric layers.

4. The method of fabricating a semiconductor device according to claim 3, wherein the step of removing portions of the first layer comprises planarizing the first layer.

5. The method of fabricating a semiconductor device according to claim 4, wherein the step of planarizing the first layer comprises planarizing the first layer at least until the second layer is exposed.

6. The method of fabricating a semiconductor device according to claim 3, wherein:
   the step of forming the gate stack foundation structure overlying the conductive fin arrangement further comprises forming the gate stack foundation structure overlying the semiconductive resistor structure; and
   the method further comprises the step of removing portions of the gate stack foundation structure overlying the semiconductive resistor structure prior to the step of forming the plurality of dielectric layers.

7. The method of fabricating a semiconductor device according to claim 3, further comprising removing portions of one or more layers of the plurality of dielectric layers overlying the semiconductive resistor structure to define contact regions in the semiconductive resistor structure.

8. The method of fabricating a semiconductor device according to claim 3, wherein forming the plurality of dielectric layers comprises:
   forming a first dielectric layer overlying the conductive fin arrangement and the semiconductive resistor structure, the first dielectric layer comprising a first dielectric material; and
   forming a second dielectric layer overlying the first dielectric layer, the second dielectric layer comprising a second dielectric material, the second dielectric material being different from the first dielectric material.

9. The method of fabricating a semiconductor device according to claim 8, wherein
   forming the first dielectric layer comprises forming an oxide layer;
   forming the second dielectric layer comprises forming a nitride layer overlying the oxide layer; and
   removing portions of the first layer of the plurality of dielectric layers comprises removing portions of the nitride layer at least until the oxide layer is exposed.

10. The method of fabricating a semiconductor device according to claim 1, wherein forming the gate stack foundation structure comprises:
    forming a layer of a high-k dielectric material overlying the conductive fin arrangement; and
    forming a layer of a conductive material overlying the high-k dielectric material.

11. A method of fabricating a semiconductor device, the method comprising:
    forming a conductive fin arrangement on a first region of a semiconductor substrate, the conductive fin arrangement comprising one or more conductive fins;
    forming a semiconductive resistor structure on a second region of the semiconductor substrate;
    forming a gate stack foundation structure overlying the conductive fin arrangement and the semiconductive resistor structure, the gate stack foundation structure comprising one or more layers of material;
    removing portions of the gate stack foundation structure overlying the semiconductive resistor structure;
    forming a plurality of dielectric layers overlying the conductive fin arrangement and the semiconductive resistor structure; and
    removing portions of the gate stack foundation structure and the plurality of dielectric layers overlying the conductive fin arrangement to define a gate structure for the semiconductor device.

12. The method of fabricating a semiconductor device according to claim 11, wherein forming the semiconductive resistor structure comprises, prior to the step of forming the gate stack foundation structure:
    depositing a polysilicon layer overlying the first region of the semiconductor substrate and the second region of the semiconductor substrate; and
    removing portions of the polysilicon layer to define the semiconductive resistor structure overlying the second region of the semiconductor substrate.

13. The method of fabricating a semiconductor device according to claim 11, further comprising removing portions of a first layer of the plurality of dielectric layers to provide a substantially planar surface prior to the step of removing portions of the gate stack foundation structure and the plurality of dielectric layers to define the gate structure, the first layer overlying a second layer of the plurality of dielectric layers.

14. The method of fabricating a semiconductor device according to claim 13, wherein:
    forming the plurality of dielectric layers comprises forming an oxide layer overlying the conductive fin arrangement and the semiconductive resistor structure, and forming a nitride layer overlying the oxide layer; and removing portions of the first layer of the plurality of dielectric layers comprises removing portions of the nitride layer at least until the oxide layer is exposed.

15. The method of fabricating a semiconductor device according to claim 14, wherein the step of removing portions of the nitride layer comprises polishing the nitride layer using chemical mechanical planarization.

16. A method of fabricating a semiconductor device, the method comprising:
   forming a conductive fin arrangement on a first region of a semiconductor substrate, the conductive fin arrangement comprising one or more conductive fins;
   forming a semiconductive resistor structure on a second region of the semiconductor substrate;
   forming a gate stack foundation structure overlying the conductive fin arrangement and the semiconductive resistor structure, the gate stack foundation structure comprising one or more layers of material;
   forming a plurality of dielectric layers overlying the gate stack foundation structure;
   removing portions of a first layer of the plurality of dielectric layers to provide a substantially planar surface, the first layer overlying a second layer of the plurality of dielectric layers; and
   removing portions of the gate stack foundation structure and the plurality of dielectric layers overlying the first region of the semiconductor substrate to define a gate structure for the semiconductor device.

17. The method of fabricating a semiconductor device according to claim 16, wherein:
   forming the plurality of dielectric layers comprises:
      conformally depositing an oxide layer overlying the conductive fin arrangement and the semiconductive resistor structure; and
      conformally depositing a nitride layer overlying the oxide layer; and
   removing portions of the first layer of the plurality of dielectric layers comprises polishing the nitride layer at least until the oxide layer is exposed.

18. The method of fabricating a semiconductor device according to claim 16, further comprising removing portions of the gate stack foundation structure and the plurality of dielectric layers overlying the semiconductive resistor structure to define contact regions in the semiconductive resistor structure.

19. The method of fabricating a semiconductor device according to claim 16, wherein forming the gate stack foundation structure comprises:
   forming a layer of a high-k dielectric material overlying the conductive fin arrangement and the semiconductive resistor structure; and
   forming a layer of a conductive material overlying the high-k dielectric material.

20. The method of fabricating a semiconductor device according to claim 16, further comprising removing portions of the gate stack foundation structure overlying the semiconductive resistor structure prior to the step of forming the plurality of dielectric layers.

* * * * *